United States Patent
Jun et al.

(10) Patent No.: US 12,506,021 B2
(45) Date of Patent: Dec. 23, 2025

(54) SUBSTRATE PROCESSING APPARATUS

(71) Applicant: ASM IP Holding B.V., Almere (NL)

(72) Inventors: SungHoon Jun, Hwaseong-si (KR); ByeongPil Park, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 659 days.

(21) Appl. No.: 17/892,780

(22) Filed: Aug. 22, 2022

(65) Prior Publication Data

US 2023/0071798 A1  Mar. 9, 2023

Related U.S. Application Data

(60) Provisional application No. 63/237,110, filed on Aug. 25, 2021.

(51) Int. Cl.
*H01L 21/67* (2006.01)
*H01L 21/687* (2006.01)

(52) U.S. Cl.
CPC .... *H01L 21/6719* (2013.01); *H01L 21/67017* (2013.01); *H01L 21/67103* (2013.01); *H01L 21/68771* (2013.01)

(58) Field of Classification Search
CPC ........... H01L 21/6719; H01L 21/67017; H01L 21/67103; H01L 21/68771
See application file for complete search history.

(56) References Cited

U.S. PATENT DOCUMENTS

| | | |
|---|---|---|
| 2006/0137609 A1 | 6/2006 | Puchacz |
| 2017/0044666 A1* | 2/2017 | Jang ........................ C30B 25/12 |
| 2020/0102651 A1* | 4/2020 | Kashyap ........... H01L 21/68771 |
| 2021/0398826 A1 | 12/2021 | Mori |
| 2023/0071798 A1* | 3/2023 | Jun ..................... H01L 21/6719 |
| 2023/0080970 A1* | 3/2023 | Jeong .................. H01L 21/6875 414/589 |

FOREIGN PATENT DOCUMENTS

| | | | |
|---|---|---|---|
| KR | 20110049986 A | * | 5/2011 |
| KR | 20160005459 A | * | 1/2016 |
| KR | 20190013109 A | * | 5/2019 |
| KR | 20200053347 A | * | 5/2020 |

* cited by examiner

*Primary Examiner* — Jeffrie R Lund
(74) *Attorney, Agent, or Firm* — Snell & Wilmer L.L.P.

(57) ABSTRACT

A top lid capable of minimizing thermal deformation when a substrate processing temperature increases includes a support for supporting the top lid, the support protruding integrally from one surface of the top lid.

18 Claims, 15 Drawing Sheets

SUBSTRATE PROCESSING APPARATUS

CROSS-REFERENCE TO RELATED APPLICATIONS

This application claims priority to U.S. Provisional Patent Application Ser. No. 63/237,110 filed Aug. 25, 2021 titled SUBSTRATE PROCESSING APPARATUS, the disclosure of which is hereby incorporated by reference in its entirety.

BACKGROUND

1. Field

One or more embodiments relate to a substrate processing apparatus, and more particularly, to a substrate processing apparatus capable of minimizing sagging of a top lid.

2. Description of the Related Art

Recently, many attempts have been made to increase the productivity (the number of substrates that can be processed per unit of time) in semiconductor manufacturing. For example, a substrate processing apparatus has a chamber structure equipped with one or more reactors to improve the substrate throughput per hour. In more detail, as shown in FIG. 1, a substrate processing apparatus 1 includes a chamber having an inner space 8, a top lid 3 coupled to an upper end of the chamber, one or more gas supply units 4 installed in the top lid 3, at least one substrate support 5 installed in the inner space 8 of the chamber, and an exhaust unit (not shown) connected to the inner space 8. The at least one substrate support 5 is installed at a position corresponding to the one or more gas supply units 4, and forms a reaction space 9 together with the gas supply unit 4. A substrate may be seated on the substrate support 5, and the one or more gas supply units 4 may supply a process gas to the substrate. The substrate support 5 may be connected to a substrate support moving unit (e.g., a drive motor) 6 provided on one side (in this case, below a chamber wall 2) of the substrate support 5 to be lifted up and down in a vertical direction, moved in a horizontal direction, and/or inclined. A stretchable portion 7 may be between the chamber wall 2 and a substrate support moving unit 6 to isolate the inner space 8 from the outside. The stretchable portion 14 may be stretched according to a movement of the substrate support 5.

However, the top lid 3 may sag due to a negative pressure (i.e., vacuum suction power) of the inner space 8 generated by the exhaust unit (not shown) such as a vacuum pump. In addition, when a substrate is processed at a high temperature, the top lid 3 may further sag due to thermal deformation. In this case, because a distance between the gas supply unit 4 and the substrate support 5 is not constant, a substrate processing result may be affected. In response to sagging of the top lid 3 and the gas supply unit 4, a distance of the reaction space 9 may be maintained constant by tilting the substrate support 5 by using the substrate support moving unit 6. However, a non-uniform gas flow in the reaction space 9 and thereby a non-uniform distribution of plasma may occur. As the plastic deformation of the top lid 3 continues, the deformation problem of the top lid may continue. In addition, a support may be installed in a vertical direction between a bottom surface of the chamber wall 2 and the top lid 3, but the complexity of a device configuration increases and interference may occur between reactors during substrate transfer.

FIG. 2 shows a perspective view of the conventional top lid 3 improved to minimize the deformation of a top lid in a high-temperature vacuum environment.

Referring to FIG. 2, the top lid 3 may include one or more first holes 12, in which the one or more gas supply units 4 (in FIG. 1) can be seated, and one or more second holes 13 connected to an exhaust (not shown) and an exhaust path in the chamber wall 2 (in FIG. 1). To minimize the deformation of a top lid, that is, to prevent a top lid from sagging, a support 10 for supporting the top lid 3 may be provided on an upper surface of the top lid 3. The support 10 may be provided between one or more first holes 12. For example, the support 10 may include a first support 10a in a horizontal direction and a second support 10b in a vertical direction.

FIG. 3 is a cross-sectional view taken along line A-B of FIG. 2. As shown in FIG. 3, a thickness of the support 10 may be, for example, 40 mm, and a thickness of the top lid 3 may be, for example, 75.5 mm. However, these thickness are not limited thereto.

Referring back to FIG. 2, the support 10 may be connected and fixed to the top lid 3 by at least one connection device 11 (e.g., a volt). At least one groove for accommodating the connection device 11 for fixing the support 10 to the top lid 3 may be formed in the support 10. For example, as shown in FIG. 2, the support 10 may be connected and fixed to the top lid 3 by 36 connection devices 11, and the support 10 may be formed with 36 grooves for accommodating 36 connection devices 11. In more detail, 18 of the 36 connection devices 11 couple the first support 10a in the horizontal direction to the upper surface of the top lid 3, and the remaining 18 of the 36 connection devices 11 may couple the second support 10b in the vertical direction to the upper surface of the top lid 3. The connection device 11 may mechanically fix the top lid 3 to the support 10 to prevent the top lid 3 from sagging downward by the negative pressure (i.e., vacuum suction power) of the inner space 8 (of FIG. 1) of a chamber.

The top lid 3 may include a first material, and the support 10 and the connection device 11 may include a second material different from the first material. For example, the top lid 3 may be formed of an aluminum (Al) material, and the support 10 and the connection device 11 may be formed of a steel use stainless (SUS) material, which is an alloy in which iron (Fe) and chromium (Cr) are mixed. As such, the conventional support 10 and the connection device 11 are formed of a material different from the top lid 3 and have thermal expansion coefficients different from that of the top lid 3. Therefore, when a substrate processing temperature increases, the thermal expansion coefficients of the support 10, the connection device 11, and the top lid 3 are different, so that the connection strength is weakened at their coupling sites, and the top lid 3 and the connection device 11 cannot effectively prevent the top lid 3 from sagging.

FIG. 4A shows that, in a substrate processing apparatus in which the conventional top lid 3 of FIG. 2 is installed, the top lid 3 slightly sags due to a vacuum force when a chamber internal pressure is lowered from the atmospheric pressure ATM to vacuum at room temperature RT. For example, a deformation degree of the top lid 3 and the gas supply unit 4 seated on the top lid 3 may be about 0.7 mm. As such, in a room temperature to low temperature area, the top lid 3 may slightly sag due to vacuum deformation, but the degree of such deformation is within a process controllable range. For example, process control is possible within an allowable range of process error by fine-tuning process parameters such as supplied gas flow rate and process pressure. However, when a substrate is processed in a high temperature area (e.g., over 500 degrees), the top lid 3 is further deformed due to the thermal deformation of a constituent material (e.g., aluminum), and substrate processing results due to this further deformation are outside the process controllable range described above.

FIG. 4B shows that the top lid 3 sags toward the inner space 8 due to the thermal deformation when the temperature of the substrate support 5 (e.g., a heating block) goes up from the room temperature RT to 550° C. in a state in which the inner space 8 is in a vacuum (i.e., the state of FIG. 4A). For example, the degree of thermal deformation of the top lid 3 and the gas supply unit 4 seated on the top lid 3 may be about 1.7 mm. In the case of FIG. 4B, because the thermal deformation (e.g., 1.7 mm) is generated in addition to the vacuum deformation that has already occurred (e.g., 0.7 mm), the total degree of deformation may be greater (e.g., 2.4 mm), and the degree of deformation is outside a process controllable range and causes process defects. In particular, because a distance between the gas supply unit 4 and the substrate support 5 is not constant, substrate processing results may be affected.

SUMMARY

One or more embodiments include a device minimizing a thermal deformation problem of a top lid of a vacuum chamber including a plurality of reactors.

Additional aspects will be set forth in part in the description which follows and, in part, will be apparent from the description, or may be learned by practice of the presented embodiments of the disclosure.

According to one or more embodiments, a top lid mounted on an upper end of a chamber of a substrate processing apparatus is provided, wherein the top lid includes a support for supporting the top lid, the support protruding integrally from one surface of the top lid.

According to an example of the top lid, the top lid and the support may include an identical material.

According to an example of the top lid, the top lid and the support may be cast as a single piece.

According to an example of the top lid, the support may be formed symmetrically with respect to a center of the top lid.

According to a further example of the top lid, at least one of height and thickness of the support may increase from an edge of the top lid toward the center of the top lid.

According to a further example of the top lid, the support may have a cross (+) shape.

According to a further example of the top lid, the cross-shaped support may include four arms, and a central crossing portion of the cross-shaped support may have a diameter greater than a width of the arms.

According to an example of the top lid, one or more holes penetrating the top lid in a vertical direction may be formed between the supports of the top lid, and a step for supporting a gas supply unit inserted through the hole may be formed at an inner edge of the one or more holes.

According to an example of the top lid, the support may not have a groove for accommodating a connection device for fixing the support to the top lid.

According to one or more embodiments, a substrate processing apparatus includes: a chamber having an inner space; a top lid coupled to an upper end of the chamber; at least one substrate support installed in the space of the chamber and on which a substrate is mounted; and one or more gas supply units configured to supply a process gas to the substrate, wherein a support for supporting the top lid is formed to protrude from one surface of the top lid, one or more holes penetrating the top lid in a vertical direction is formed between supports of the top lid, a step supporting a gas supply unit inserted through the hole is formed at an inner edge of the one or more holes, and each of the one or more gas supply units may be seated on a step of one of the one or more holes.

According to an example of the substrate processing apparatus, the top lid and the support may include an identical material.

According to an example of the substrate processing apparatus, the top lid and the support may have an identical thermal expansion coefficient.

According to an example of the substrate processing apparatus, even if a substrate processing temperature increases, a distance between the gas supply unit and the substrate support may be constantly maintained.

According to an example of the substrate processing apparatus, the support is formed to protrude from an upper surface of the top lid, and an upper surface of the support may be above an upper surface of the gas supply unit.

According to an example of the substrate processing apparatus, the top lid and the support may be integrally formed, and the top lid may be less sagging downward when a substrate processing temperature increases than when the top lid and the support are formed in a detachable type.

According to a further example of the substrate processing apparatus, a separate connection device connecting the top lid to the support may not be provided.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
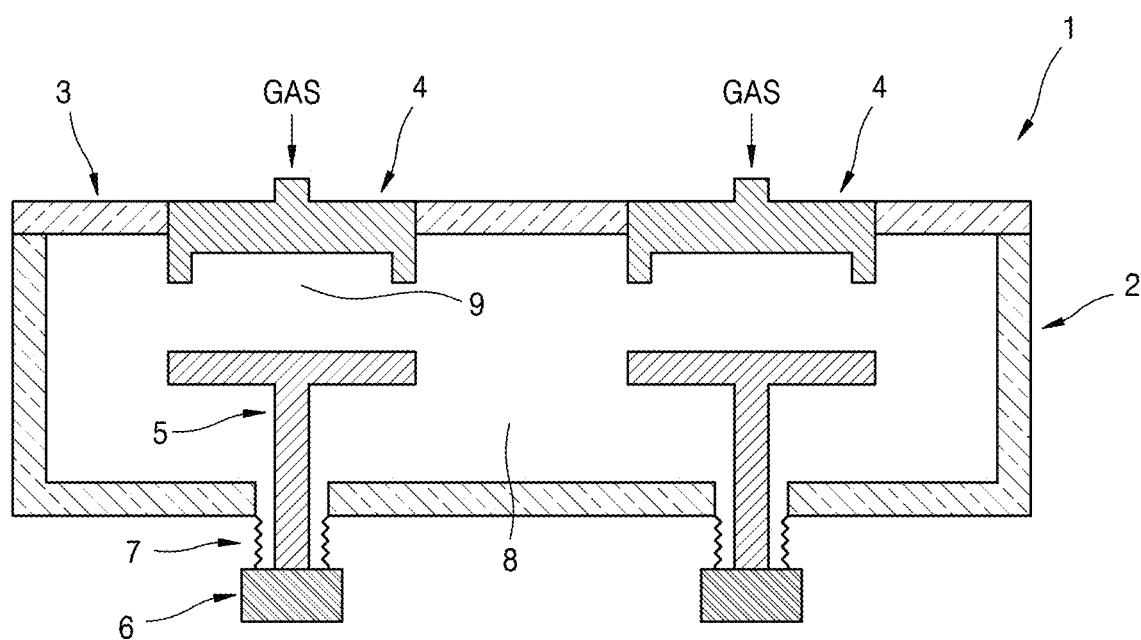
FIG. 1 is a cross-sectional view of a substrate processing apparatus including a plurality of reactors.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described more fully with reference to the accompanying drawings.

In this regard, the present embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

Although a deposition device of a semiconductor or a display substrate is described herein as the substrate processing apparatus, it is to be understood that the disclosure is not limited thereto. The substrate processing apparatus may be any device necessary for performing deposition of a material for forming a thin film, and may refer to a device in which a raw material for etching or polishing the material is uniformly supplied.

Figure 5:
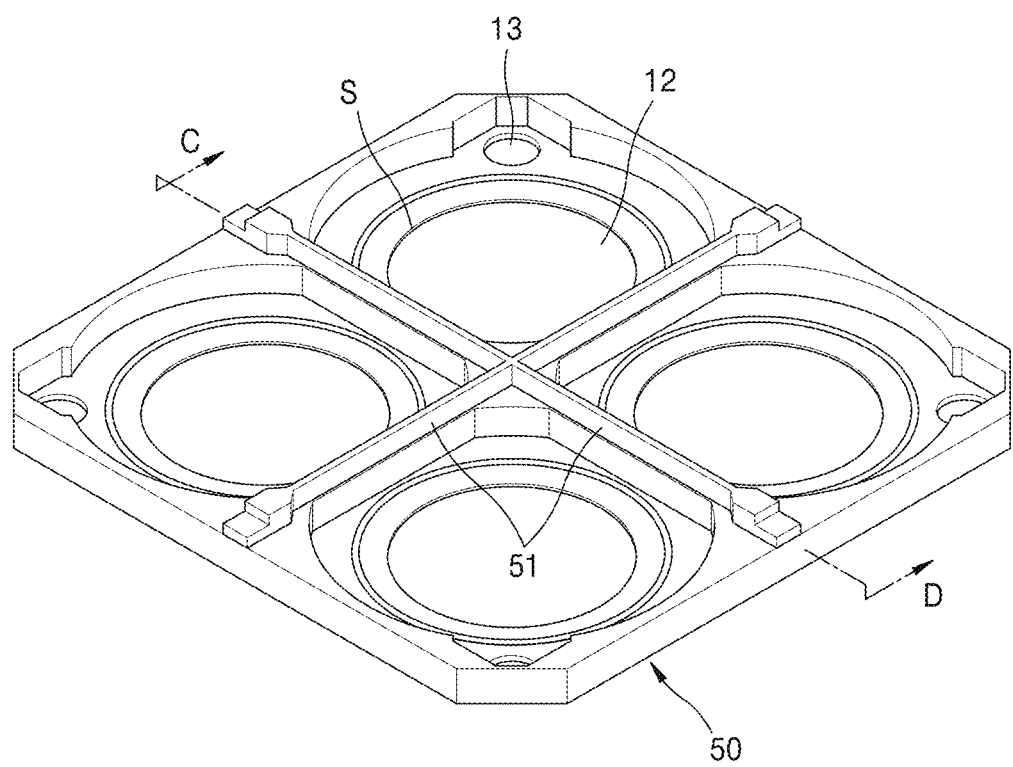
FIG. 5 is a perspective view of a top lid according to embodiments.

FIG. 5 is a perspective view of a top lid according to embodiments.

Figure 2:
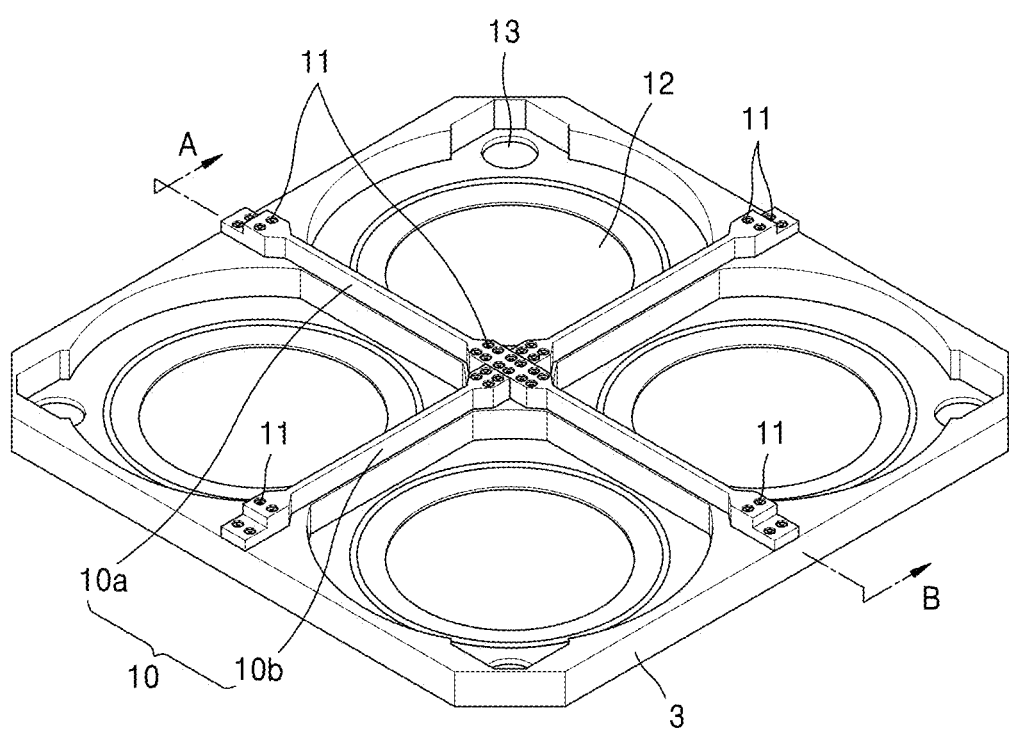
FIG. 2 is a perspective view of a conventional top lid including a detachable support.

Unlike the detachable support 10 of the conventional top lid 3 of FIG. 2, a support 51 of a top lid 50 of FIG. 5 may be integrally configured with the top lid 50. In other words, the support 51 may support the top lid 50 as a part of the top lid 50. In more detail, the support 51 for supporting the top lid 50 may be formed to protrude from one surface of the top lid 50. In FIG. 5, the support 51 is shown to be formed on an upper surface of the top lid 50, but in another embodiment, the support 51 may be formed on a lower surface of the top lid 50.

The top lid 50 and the support 51 may include an identical material. For example, the top lid 50 and the support 51 may include the same aluminum (Al) material. Accordingly, the top lid 50 and the support 51 may have the same thermal expansion coefficient, and there is no concern of a decrease in coupling strength due to a difference in thermal expansion coefficient between dissimilar metals as in the conventional top lid of FIG. 2, and the degree of sagging of the top lid may be minimized.

The top lid 50 and the support 51 may be cast as a single piece. Accordingly, unlike the conventional top lid 50 of FIG. 2, a top lid according to embodiments does not require a separate connection device (e.g., a volt) for connecting and fixing the top lid 50 to the support 51. In addition, the support 51 may not have a groove for accommodating a connection device for fixing the support 51 to the top lid 50. In other words, a surface of the support 51 may be smooth without grooves. This single-piece design of the top lid 50 and the support 51 may simplify a forming process of the top lid 50.

In order to uniformly support the top lid 50, that is, to uniformly improve deformation resistance of the top lid 50, the support 51 may be formed symmetrically with respect to a center of the top lid 50. For example, it should be noted that the support 51 may have a cross (+) shape including four arms as shown in FIG. 5, but the disclosure is not limited thereto.

Figure 3:
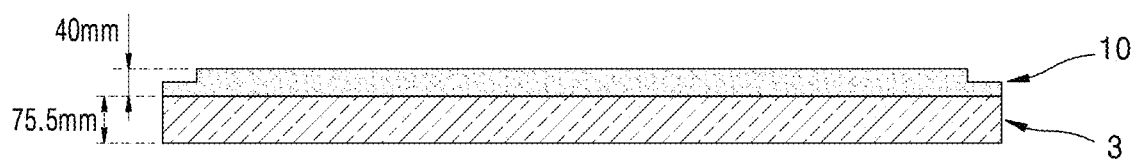
FIG. 3 is a cross-sectional view taken along line A-B of FIG. 2.
Figure 6:
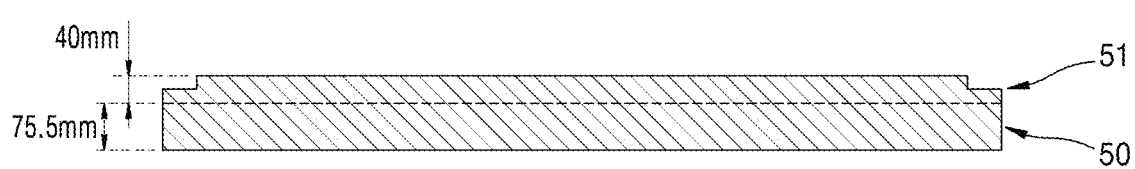
FIG. 6 is a cross-sectional view taken along line C-D of FIG. 5.

In general, as the thickness of a metal base material increases and the cross-sectional area increases, the stiffness increases and the resistance to deformation increases. Accordingly, by increasing a thickness of the top lid 50, a problem that the top lid 50 is sagging may be minimized. FIG. 6 is a cross-sectional view taken along line C-D of FIG. 5. As shown in FIG. 6, by setting a thickness of the support 10 to 40 mm, a thickness of the top lid 3 may have an effect of increasing from 75.7 mm (FIG. 3) to 115.5 mm, and deformation resistance may be increased compared to the conventional top lid.

Figure 4A:
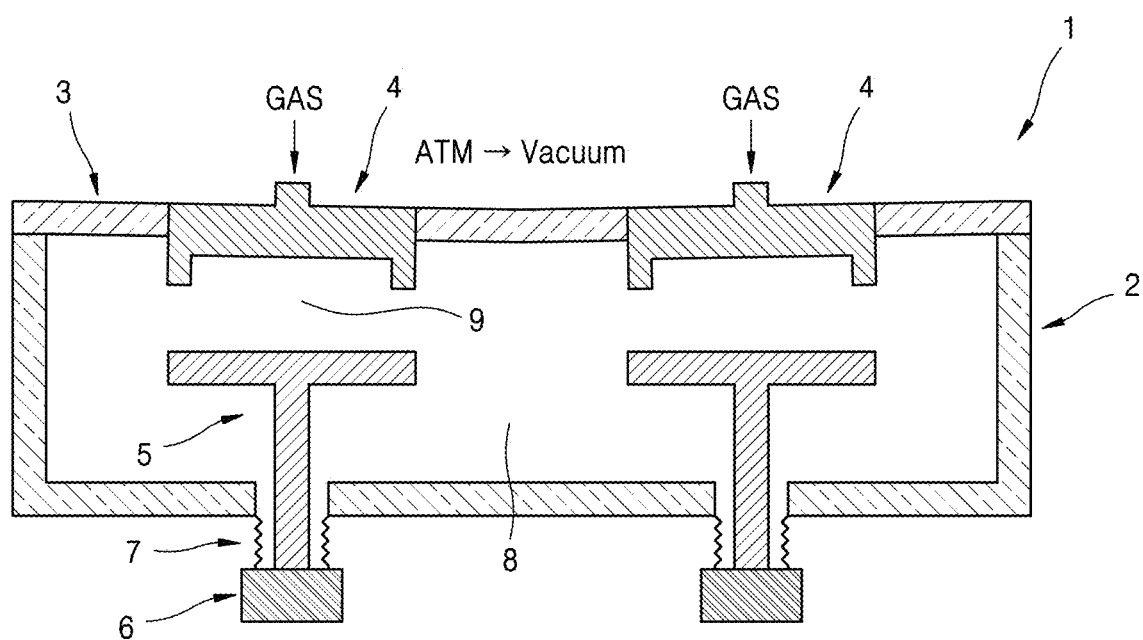
FIG. 4A is a view illustrating deformation of the top lid of FIG. 2 by vacuum.
Figure 4B:
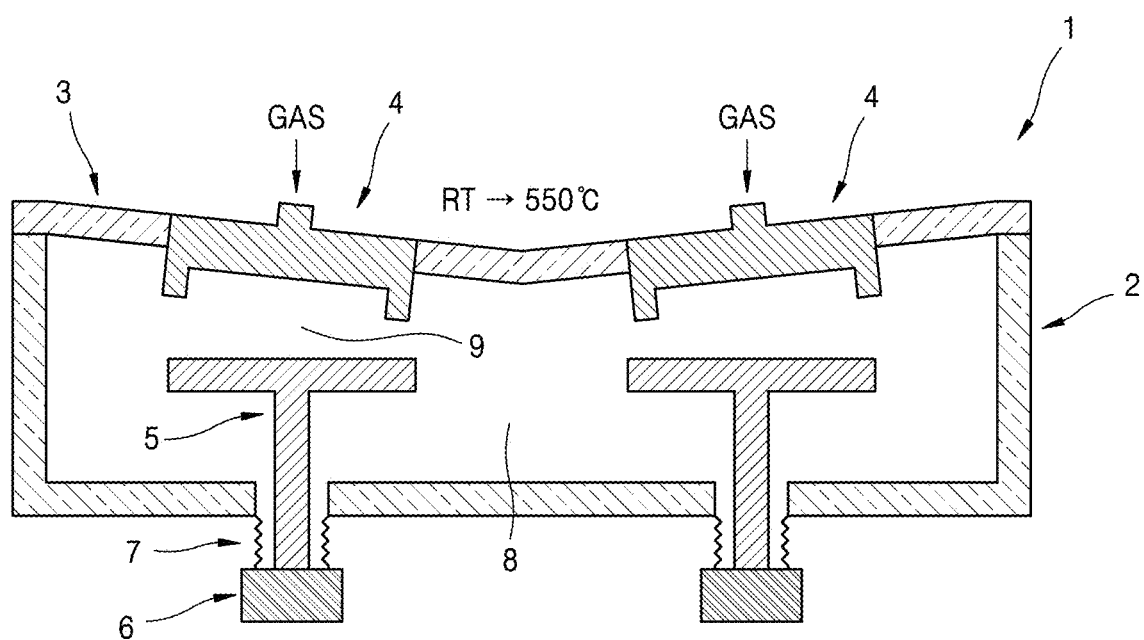
FIG. 4B is a view illustrating thermal deformation due to a high temperature in addition to the deformation of the top lid by vacuum.
Figure 7:
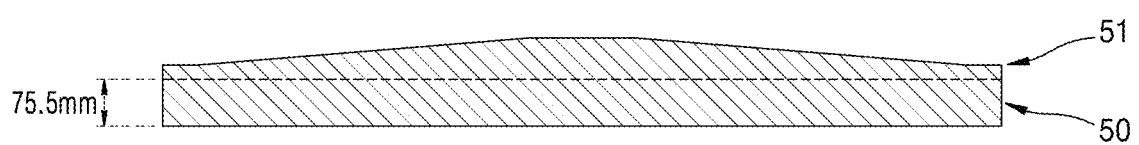
FIG. 7 is a cross-sectional view of a top lid according to further embodiments.

In general, as shown in FIGS. 4A and 4B, thermal deformation of the center is greater than that of an edge of the top lid 50. In order to minimize the degree of deformation of the center of the top lid 50, at least one of height and thickness of the support 51 may increase from the edge of the top lid 50 toward the center of the top lid 50. For example, as shown in FIG. 7, the height of the support 51 may increase from the edge of the top lid 50 toward the center of the top lid 50. In another example, a central cross section of the cross-shaped support may have a diameter greater than the width of the four arms. In another example, as shown in FIG. 8, because the support 51 has a wide flat portion 52 at the center of the top lid 50, deformation resistance of the center of the top lid 50 having the greatest degree of deformation may be further improved.

Referring back to FIG. 5, the one or more first holes 12 penetrating the top lid 50 in a vertical direction may be formed between supports 51 of the top lid 50. A step S for supporting a gas supply unit (not shown) inserted through the first hole 12 may be formed at an inner edge of the one or more first holes 12. Each of one or more gas supply units may be seated in the step S of one of one or more first holes 12. The gas supply units and the first holes 12 may be provided as many as the number of reaction spaces in which a substrate is processed.

The top lid 50 may also include one or more second holes 13 connected to an exhaust unit (not shown) and an exhaust path in the chamber wall 2 (in FIG. 1). The one or more second holes 13 may connect the exhaust portion (not shown) of the reactor to the exhaust path in the chamber wall 2 (in FIG. 1) to form a path through which a process gas in a chamber is exhausted. The second hole 13 may be formed in a corner portion of the top lid 50.

Figure 8:
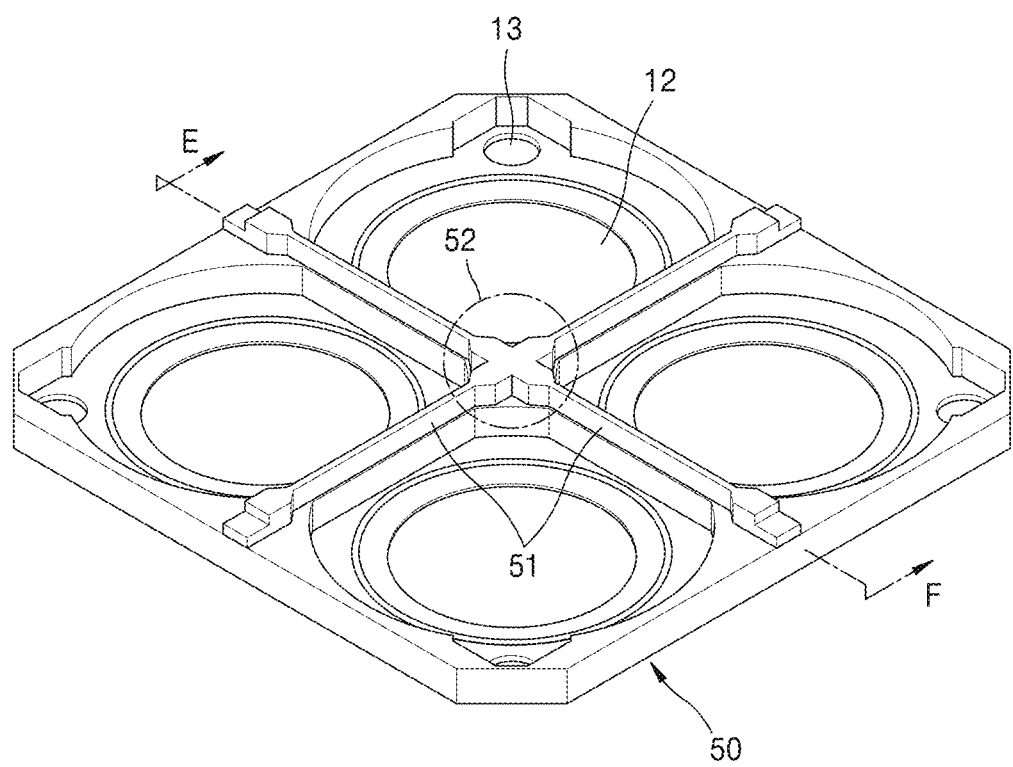
FIG. 8 is a perspective view of a top lid according to further embodiments.

FIG. 8 is a perspective view of a top lid according to further embodiments.

Figure 9:
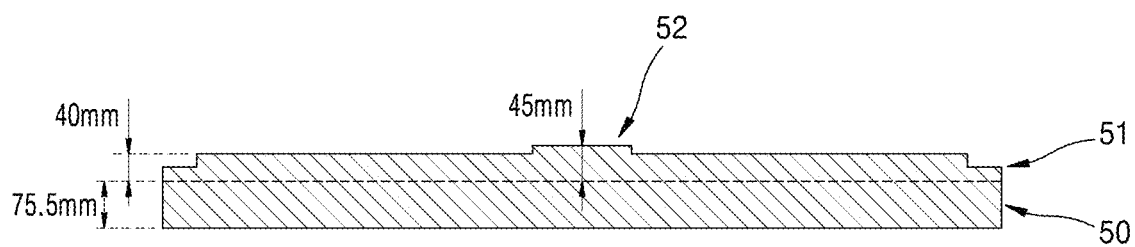
FIG. 9 is a cross-sectional view taken along line E-F of FIG. 8.

As described above, in general, the thermal deformation of the center of the top lid 50 is greater than that of the edge of the top lid 50. In order to minimize the degree of deformation of the center of the top lid 50, the support 51 may have a wide flat portion 52 at the center of the top lid 50. In order to further improve the deformation resistance of the center of the top lid 50, the support 51 may have a greater height in the central portion of the top lid 50. FIG. 9 is a cross-sectional view taken along line E-F of FIG. 8. As shown in FIG. 9, for example, the height at the center of the top lid 50 of the support 51 may be 45 mm greater than a height (40 mm) at the edge of the top lid 50.

Figure 10:
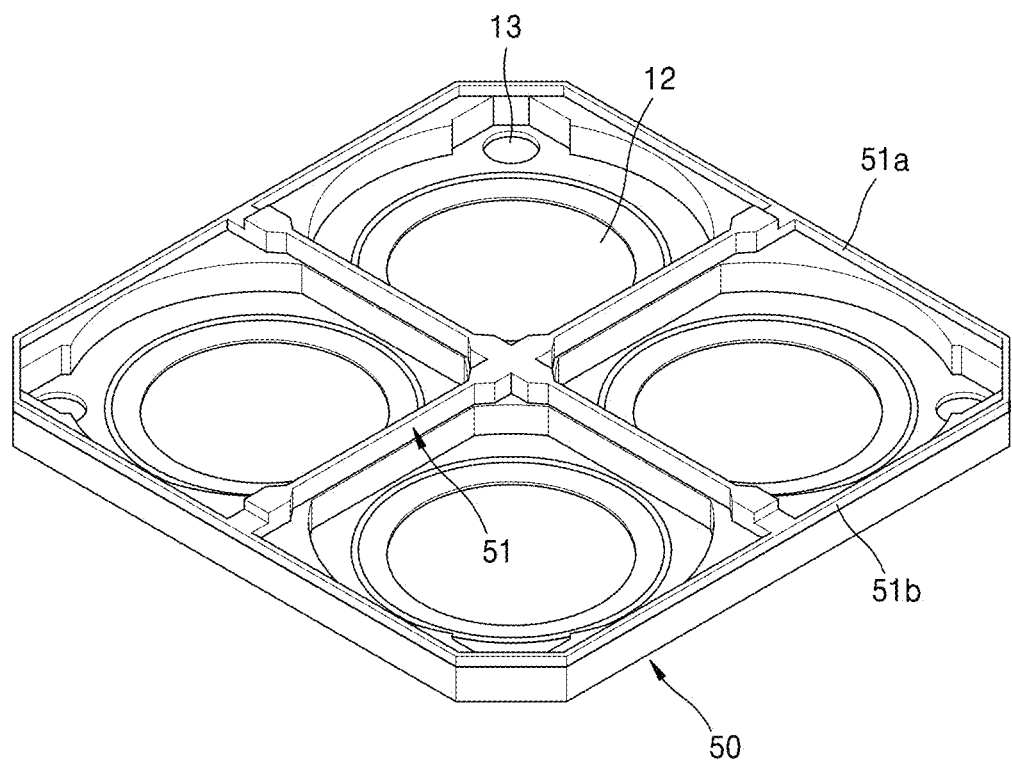
FIG. 10 is a perspective view of a top lid according to other embodiments.

FIG. 10 is a perspective view of a top lid according to other embodiments.

In order to further improve the deformation resistance of the top lid 50, the support 51 may include, in addition to the cross (+) shape with 4 arms, two horizontal extension portions 51a and two vertical extension portions 51b extending along the edge of the top lid 50. By further including the two horizontal extension portions 51a and the two vertical extension portions 51b, the top lid 50 of FIG. 10 may have greater deformation resistance than the top lid 50 of FIG. 5.

Figure 11:
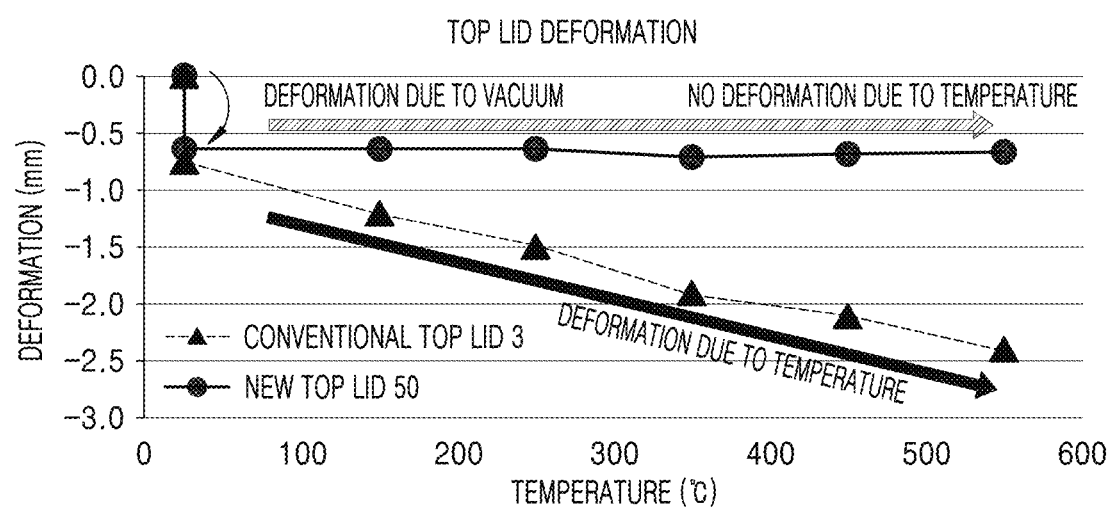
FIG. 11 is a graph illustrating the degree of deformation due to vacuum and high temperature of the top lid of FIG. 2 and the top lid of FIG. 5.

FIG. 11 is a graph illustrating the degree of deformation due to vacuum and high temperature of the top lid of FIG. 2 and the top lid of FIG. 5. Table 1 below is a graph illustrating the degree of deformation due to vacuum and high temperature of 550° C. of the top lid of FIG. 2 and the top lid of FIG. 5.

TABLE 1

|  | Conventional top lid 3 of FIG. 2 | Top lid 50 of FIG. 5 |
| --- | --- | --- |
| Degree of sagging due to vacuum deformation (mm) | 0.7. | 0.6 |
| Degree of sagging due to thermal deformation (mm) | 1.7. | 0.0 |
| Total degree of sagging (mm) | 2.4. | 0.6 |

Referring to FIG. 11 and Table 1, in a case where the top lid 3 of FIG. 2 is provided with a detachable support 10 made of a different material, sagging of about 0.7 mm may occur due to initial vacuum deformation. Thereafter, it can be seen that the degree of thermal deformation increases as the temperature increases. At a substrate processing temperature of 550° C., the degree of sagging due to thermal deformation of the conventional top lid 3 of FIG. 2 is about 1.7 mm, and the total degree of sagging is about 2.4 mm. However, in the case of the top lid 50 of FIG. 5 having an integral support 51 made of the same material, it can be seen that, although sagging of about 0.6 mm occurs due to initial vacuum deformation, thermal deformation due to the increase in temperature hardly occurs. At a substrate processing temperature of 550° C., the degree of sagging due to the thermal deformation of the top lid 50 of FIG. 5 is about 0.0 mm, and the total degree of sagging is about 0.6 mm.

In general, the degree of deformation of a top lid that can be controlled by adjusting a process is within 1.0 mm. Each of the top lid 3 of FIG. 2 and the top lid 50 of FIG. 5 has a vacuum deformation that is within the controllable range of the process. However, during high-temperature treatment, the total degree of sagging of the top lid 3 of FIG. 2 is out of the controllable range while the total degree of sagging of the top lid 50 of FIG. 5 is within the controllable range.

As such, a detachable top lid 3 (in FIG. 2) and an integral top lid 50 (in FIG. 5) have almost the same degree of vacuum deformation, but the degrees of thermal deformation are different from each other. As described above, the thermal expansion coefficients of the conventional support 10, the connection device 11, and the top lid 3 are different from each other, so that the connection strength is weakened at their coupling sites, and the top lid 3 and the connection device 11 cannot effectively prevent the top lid 3 from sagging downward. However, the top lid 50 and the support 51 according to the embodiments may have the same thermal expansion coefficient, and there is no concern of a decrease in coupling strength due to a difference in thermal expansion coefficient between dissimilar metals as in the conventional top lid, and the degree of sagging of the top lid may be minimized.

From FIG. 11 and Table 1, it can be seen that when a top lid and a support are of an integrated type rather than a separate type, the degree of deformation according to the temperature of the top lid may be reduced.

Figure 12:
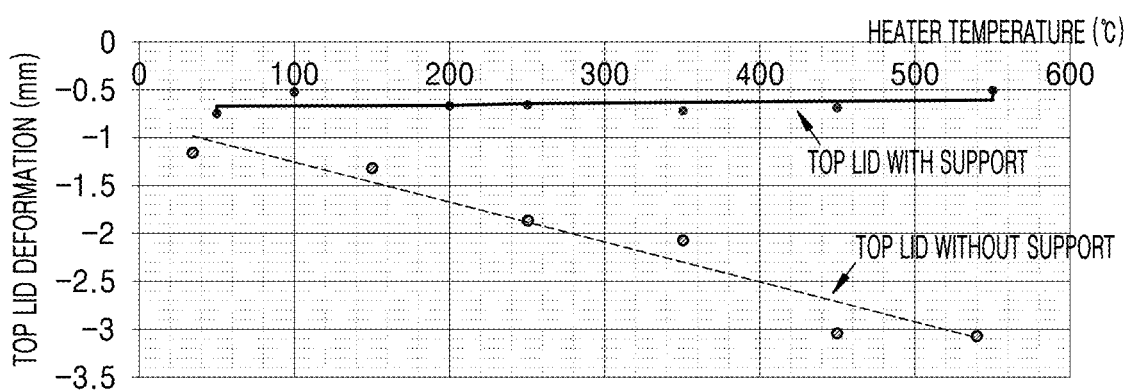
FIG. 12 is a graph illustrating the degree of deformation according to the temperature of a top lid without a support and a top lid with an integral support.

FIG. 12 is a graph illustrating the degree of deformation according to the temperature of a top lid without a support and a top lid with an integral support (the top lid 50 in FIG. 5).

In the case of the top lid without a support, sagging of about 1.1 mm may occur due to initial vacuum deformation. This is greater than the initial degree of vacuum deformation (about 0.7 mm) of the top lid 3 of FIG. 2 provided with the detachable support 10 made of different materials. Thereafter, it can be seen that the degree of thermal deformation increases as the temperature increases. At a substrate processing temperature of 550° C., the degree of sagging due to thermal deformation of the top lid without a support is about 2.0 mm, and the total degree of sagging is about 3.1 mm. It can be seen that the degree of sagging due to thermal deformation is also greater than the degree of thermal deformation of the top lid 3 of FIG. 2 having the detachable support 10.

In the case of the top lid with an integral support (the top lid 50 in FIG. 5), as described above, it can be seen that, although sagging of about 0.6 mm occurs due to initial vacuum deformation, thermal deformation due to the increase in temperature hardly occurs. At a substrate processing temperature of 550° C., the degree of sagging due to the thermal deformation of the top lid 50 of FIG. 5 is about 0.0 mm, and the total degree of sagging is about 0.6 mm.

From FIG. 12, it can be seen that when there is a protrusion (i.e., an integrated support) from one surface of the top lid than when there is no protrusion, the degree of deformation of the top lid is constant and minimized regardless of the temperature. In other words, it is preferable that a protrusion (e.g., having a thickness of 40 mm) is formed between the first holes 12 (in FIG. 5), so that a thickness (e.g., 115.5 mm) of the top lid between the first holes is greater than a thickness (e.g., 70.5 mm) of the top lid corresponding to a thickness of a gas supply unit mounted in the first holes. For example, a support is formed to protrude on an upper surface of the top lid, and an upper surface of the support is above the upper surface of the gas supply unit mounted in the first holes, thereby increasing deformation resistance of the top lid. When a support is formed to protrude on a lower surface of the top lid, a lower surface of the support is below the lower surface of the gas supply unit mounted in the first holes, thereby increasing deformation resistance of the top lid.

Figure 13:
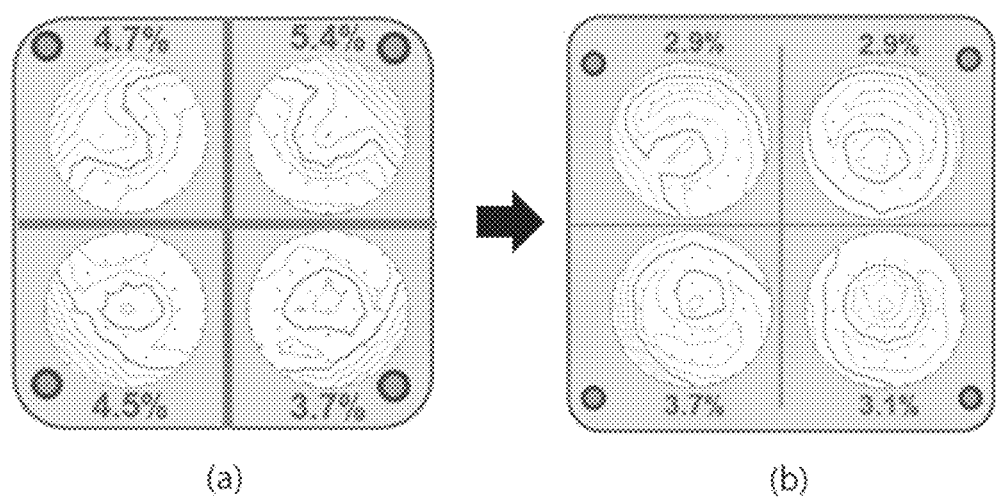
FIG. 13 (a) shows the uniformity of a thin film for each reactor in a substrate processing apparatus equipped with the conventional top lid of FIG. 2, and FIG. 13 (b) shows the uniformity of a thin film for each reactor in a substrate processing apparatus equipped with the top lid of FIG. 5.

FIG. 13 (a) shows the uniformity of a $SiO_2$ thin film for each reactor in the substrate processing apparatus equipped with the conventional top lid of FIG. 2 when the $SiO_2$ thin film is deposited by plasma enhanced atomic layer deposition (PEALD) at a substrate processing temperature of 550° C., and FIG. 13 (b) shows the uniformity of a $SiO_2$ thin film for each reactor in the substrate processing apparatus equipped with the top lid of FIG. 5.

In the case of using the conventional detachable top lid 3 and the support 10 of FIG. 2 (FIG. 13 (a)), when a substrate is treated at a high temperature (550° C.), the top lid sags considerably due to thermal deformation. In this case, a distance between the gas supply unit 4 (in FIG. 1) and the substrate support 5 (in FIG. 1) is not constant, and thus a thin film may not be uniformly deposited in each reactor.

However, when top lid 50 and the support 51 of FIG. 5 of the integrated type are used (FIG. 13 (b)), the degree of thermal deformation of the top lid 50 may be minimized. Accordingly, even if a substrate processing temperature increases, a distance between the gas supply unit 4 (in FIG. 1) and the substrate support 5 (in FIG. 1) may be kept constant, and a thin film may be more uniformly deposited in each reactor. That is, an integrated top lid and a support according to the disclosure have a technical effect to keep a distance between a gas supply unit and a substrate support constant at a high temperature without tilting the substrate support or without a vertical support for supporting the top lid in a chamber interior space.

As such, from FIG. 5 and FIG. 13, it can be seen that thin film uniformity is improved when the integrated top lid 50 and the supports 51 are used, compared to the case where the conventional detachable top lid and supports are used.

Figure 14:
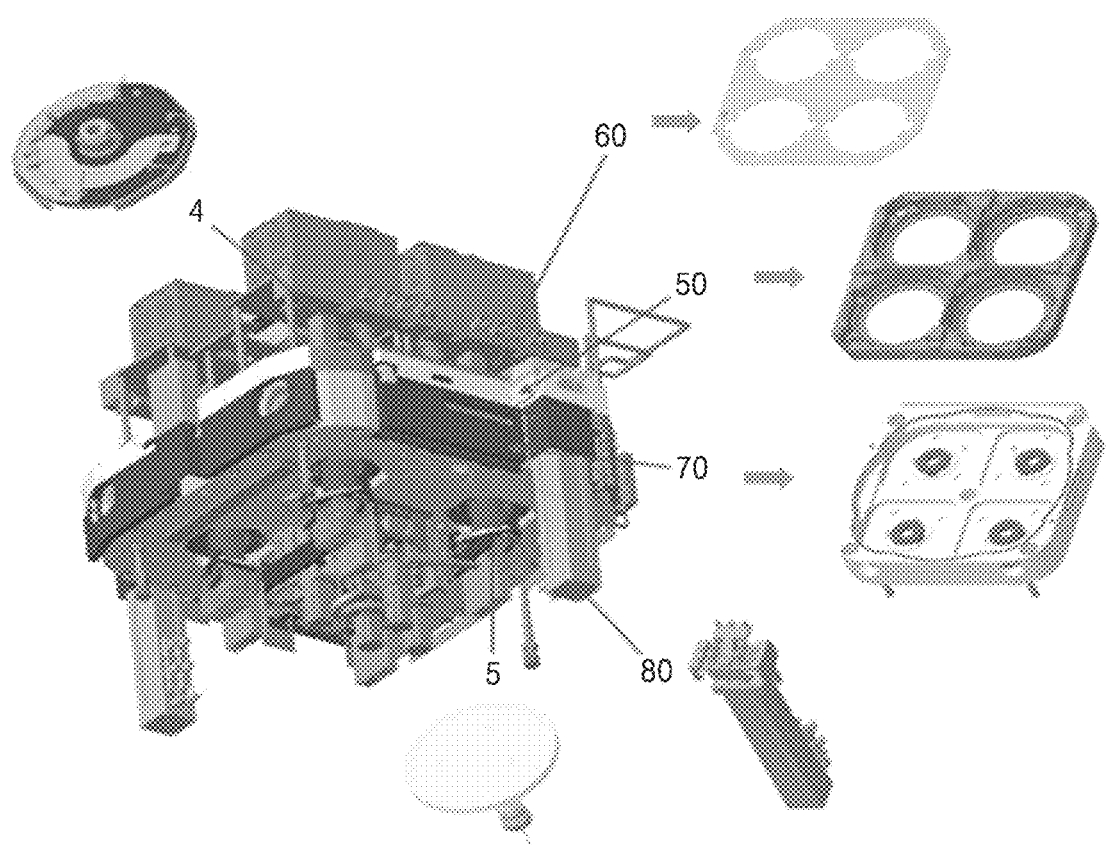
FIG. 14 is a perspective view of a substrate processing apparatus equipped with a top lid according to embodiments.

FIG. 14 is a perspective view of a substrate processing apparatus equipped with the top lid 50 according to embodiments.

The substrate processing apparatus may include a chamber 70 having an inner space, the top lid 50 coupled to an upper end of the chamber, an upper plate 60 coupled to an upper end of the top lid 50, an elevating device 80 capable of selectively elevating the top lid 50 and the upper plate 60, the one or more gas supply units 4 installed in the top lid, the at least one substrate support 5 installed in the space of the chamber. The substrate processing apparatus may further include an exhaust unit (not shown) arranged in a step formed at an inner edge of the one or more first holes 12 (in FIG. 5) of the top lid 50. The one or more gas supply units 4 may be seated on an upper surface of the exhaust unit. The at least one substrate support 5 may be installed at a position corresponding to the one or more gas supply units 4 to form a reaction space together with the gas supply unit 4. A substrate may be seated on the substrate support 5, and the one or more gas supply units 4 may supply a process gas to the substrate.

A specific embodiment of the upper plate 60 and the elevating device 80 of the gas processing apparatus is described in detail in US Patent Publication No. 2018/0033674.

It is to be understood that the shape of each portion of the accompanying drawings is illustrative for a clear understanding of the disclosure. It should be noted that the portions may be modified into various shapes other than the shapes shown.

According to an embodiment, by forming a top lid and a top lid support used in a substrate processing apparatus including a plurality of reactors integrally and/or of the same material, deformation of the top lid due to a vacuum suction force generated by a vacuum pump and especially due to a high temperature may be minimized. According to an embodiment, even if a substrate processing temperature increases, a distance between a gas supply unit and a substrate support, that is, the height of a reaction space may be maintained constant. Therefore, because there is no need to tilt the substrate support even at high temperatures, and furthermore, there is no need to separately install a vertical support for supporting a top lid in a chamber interior space, specifically between a chamber bottom surface and the top lid, the complexity of a device configuration may be minimized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A top lid mounted on an upper end of a chamber of a substrate processing apparatus, the top lid comprising:
   a support for supporting the top lid, the support protruding integrally from one surface of the top lid,
   wherein the top lid and the support are cast as a single piece, and
   wherein the top lid sags less when a substrate processing temperature increases than when the top lid and the support are of a detachable type.

2. The top lid of claim 1, wherein the top lid and the support include an identical material.

3. The top lid of claim 1, wherein the support is formed symmetrically with respect to a center of the top lid.

4. The top lid of claim 3, wherein at least one of a height and a thickness of the support increases from an edge of the top lid toward the center of the top lid.

5. The top lid of claim 3, wherein the support has a cross (+) shape.

6. The top lid of claim 5, wherein
   the cross-shaped support includes four arms, and
   a central crossing portion of the cross-shaped support has a diameter greater than a width of the arms.

7. The top lid of claim 1, wherein
   one or more holes penetrating the top lid in a vertical direction are formed between the support of the top lid, and
   a step supporting a gas supply unit inserted through the hole is formed at an inner edge of the one or more holes.

8. The top lid of claim 1, wherein the support does not have a groove for accommodating a connection device for fixing the support to the top lid.

9. The top lid of claim 1, wherein the support supports the top lid uniformly along the support.

10. The top lid of claim 1, wherein deformation of the top lid does not increase between 0 and 550° C.

11. A substrate processing apparatus comprising:
a chamber having an inner space;
a top lid coupled to an upper end of the chamber;
at least one substrate support installed in the inner space of the chamber and on which a substrate is mounted; and
one or more gas supply units configured to supply a process gas to the substrate,
wherein a support for supporting the top lid is formed to protrude from one surface of the top lid,
one or more holes penetrating the top lid in a vertical direction are formed between the support of the top lid,
a step supporting a gas supply unit inserted through the hole is formed at an inner edge of the one or more holes, and
each of the one or more gas supply units is seated on a step of one of the one or more holes,
wherein the top lid and the support are integrally formed as a single piece, and
wherein the top lid sags less when a substrate processing temperature increases than when the top lid and the support are of a detachable type.

12. The substrate processing apparatus of claim 11, wherein the top lid and the support include an identical material.

13. The substrate processing apparatus of claim 11, wherein the top lid and the support have an identical thermal expansion coefficient.

14. The substrate processing apparatus of claim 11, wherein, in a case where a substrate processing temperature increases, a distance between the gas supply unit and the substrate support is maintained constant.

15. The substrate processing apparatus of claim 11, wherein
the support is formed to protrude from an upper surface of the top lid, and
an upper surface of the support is above an upper surface of the gas supply unit.

16. The substrate processing apparatus of claim 11, wherein a separate connection device connecting the top lid to the support is not provided.

17. The substrate processing apparatus of claim 11, wherein the support supports the top lid uniformly along the support.

18. The substrate processing apparatus of claim 11, wherein a degree of deformation of the top lid during substrate processing is less than 1.0 mm.

* * * * *